United States Patent
Kolanko et al.

(10) Patent No.: US 9,913,355 B2
(45) Date of Patent: Mar. 6, 2018

(54) METHOD OF FORMING A SEQUENCING SYSTEM AND STRUCTURE THEREFOR

(71) Applicant: Semiconductor Components Industries, LLC, Phoenix, AZ (US)

(72) Inventors: Frank J. Kolanko, North Smithfield, RI (US); Sam J. B. W. Vermeir, Hofstade (BE); Brian Blackburn, Rochester, MI (US); Wim Van de Maele, Bissegem (BE); Benjamin M. Rice, Norwell, MA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 395 days.

(21) Appl. No.: 14/804,166

(22) Filed: Jul. 20, 2015

(65) Prior Publication Data

US 2016/0033584 A1 Feb. 4, 2016

Related U.S. Application Data

(60) Provisional application No. 62/031,060, filed on Jul. 30, 2014.

(51) Int. Cl.
| | |
|---|---|
| *G01R 31/28* | (2006.01) |
| *H05B 37/03* | (2006.01) |
| *H05B 33/08* | (2006.01) |
| *G01R 31/02* | (2006.01) |

(52) U.S. Cl.
CPC ....... *H05B 37/036* (2013.01); *H05B 33/0887* (2013.01); *G01R 31/026* (2013.01)

(58) Field of Classification Search
CPC .. G01R 1/0466; G01R 31/025; G01R 1/0433; G01R 1/04; G01R 1/0416; G01R 31/2889; G01R 31/2893
USPC ......... 324/500, 537, 756.01, 756.02, 756.07, 324/763.01
See application file for complete search history.

(56) References Cited

U.S. PATENT DOCUMENTS

| | | | | |
|---|---|---|---|---|
| 5,232,243 A | * | 8/1993 | Blackburn | B60N 2/002 177/144 |
| 7,911,220 B2 | * | 3/2011 | Takamiya | G01R 31/31709 324/763.01 |
| 8,035,409 B2 | * | 10/2011 | Deutsch | G01R 31/2822 324/520 |
| 2006/0117232 A1 | * | 6/2006 | Warren, Jr. | G01R 31/31723 714/724 |
| 2006/0208755 A1 | * | 9/2006 | Bjork | G01R 31/2863 324/750.05 |
| 2014/0164858 A1 | * | 6/2014 | Luo | G01R 31/318536 714/726 |
| 2014/0266749 A1 | * | 9/2014 | Thomas | G09F 9/33 340/641 |

* cited by examiner

*Primary Examiner* — Jermele M Hollington
*Assistant Examiner* — Taqi Nasir
(74) *Attorney, Agent, or Firm* — Ramey & Schwaller, LLP

(57) ABSTRACT

In one embodiment, a sequencing system includes a plurality of integrated circuits connected in a daisy chain arrangement, where each integrated circuit has an LED load connection. The system includes a diagnostic circuit which signals to the control unit that an open circuit condition has been detected, thereby turning off all LED loads.

17 Claims, 3 Drawing Sheets

US 9,913,355 B2

METHOD OF FORMING A SEQUENCING SYSTEM AND STRUCTURE THEREFOR

CROSS REFERENCE TO RELATED APPLICATIONS

This application claims priority to Provisional U.S. Application Ser. No. 62/031,060, titled "SEQUENCING LIGHTING SYSTEM" and filed Jul. 30, 2014 by Frank J. Kolanko, Sam J. B. W. Vermeir, Brian Blackburn, Wim Van de Maele, and Benjamin M. Rice which is hereby incorporated by reference.

BACKGROUND

Embodiments disclosed in the present invention relate generally to electrical technology, and more specifically to a circuit detection device which integrates fault reporting of a plurality of devices connected in a daisy chain arrangement.

In many light applications, it is desirable to have a sequencing system using light emitting diodes (LEDs), whereby a combination of integrated circuits (ICs) are often connected in a daisy chain arrangement or serial arrangement, with signals from one output of an IC connecting to an input of a subsequent IC to turn on a particular LED load. This arrangement, however, does not provide detection of connectivity issues and a mechanism to relay a connection issue to a control unit. Since each LED load is part of a total system of lighting, any LED open load causes system degradation. In order to avoid system degradation due to an open load condition, all LEDs in the system must be turned off. Accordingly, it would be desirable to have LED sequencing drivers that incorporate an open circuit detection and reporting system.

For simplicity and clarity of illustration, elements in the figures are not necessarily drawn to scale, and the same reference numbers in different figures denote generally the same elements. Additionally, description and details of well-known steps, elements, and circuitry are omitted for simplicity of the description. For example, display control (functional) circuitry has been omitted, however, one of ordinary skill in the art would understand how to implement this circuitry. When used in reference to a state of a signal, the term "asserted" means an active state of the signal and inactive means an inactive state of the signal. The actual voltage value or logic state (such as a "1" or a "0") of the signal can depend on whether positive or negative logic is used. Thus, "asserted" can be either a high voltage or high logic or a low voltage or low logic depending on whether positive or negative logic is used and negated may be either a low voltage or low state or a high voltage or high logic depending on whether positive or negative logic is used. Those skilled in the art understand that either a positive or negative logic convention could be used. The terms "first", "second", "third" and the like in the Claims or/and in the Detailed Description of the Drawings, are used for distinguishing between similar elements and are not necessarily for describing a sequence, either temporally, spatially, in ranking or in any other manner. It is understood that the terms so used are interchangeable under appropriate circumstances and that the embodiments described herein are capable of operation in other sequences than described or illustrated herein.

DETAILED DESCRIPTION OF THE DRAWINGS

Figure 1:
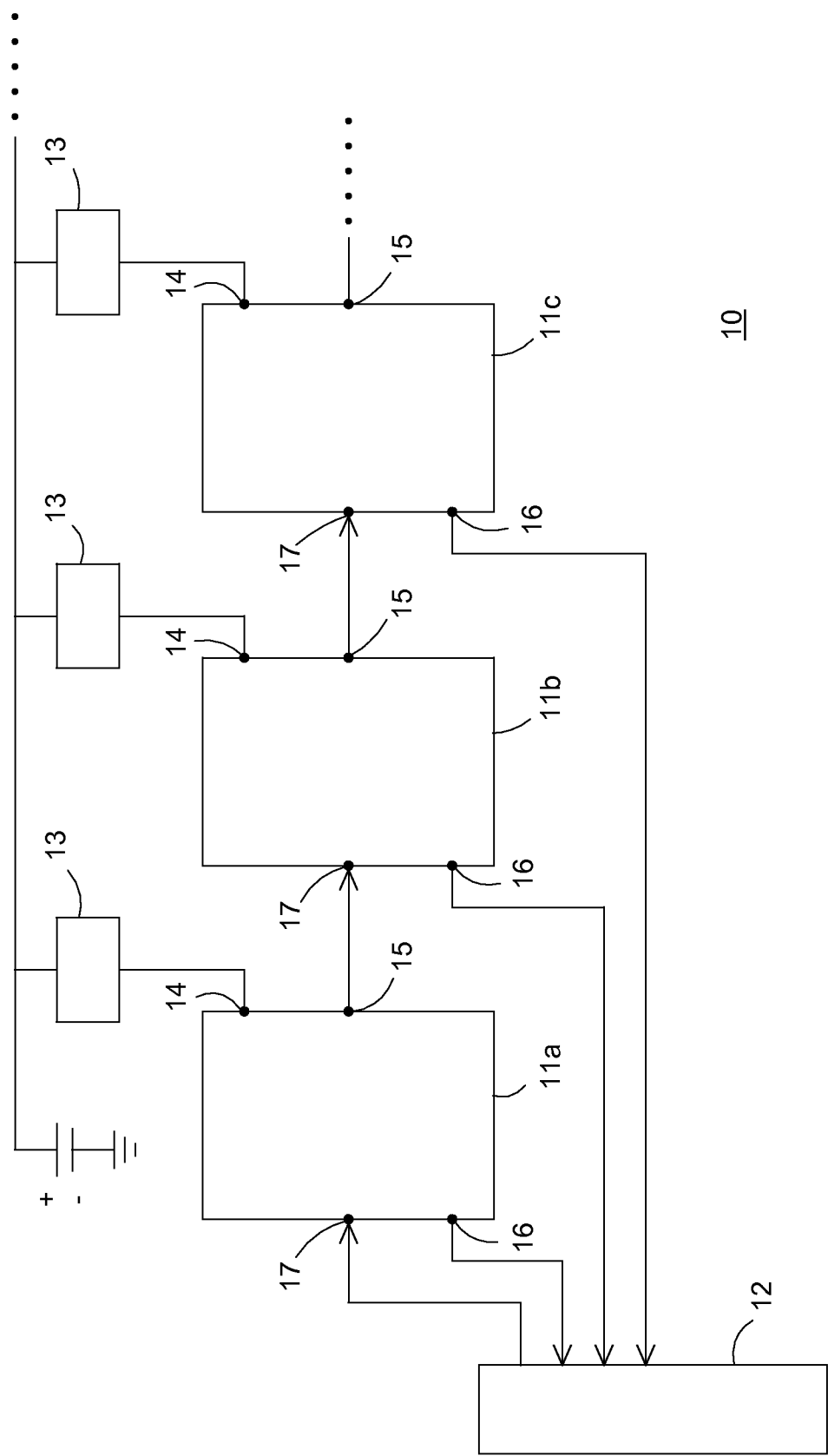
FIG. 1 illustrates a block diagram of a sequencing system in accordance with an embodiment of the present invention.

FIG. 1 illustrates a block diagram of a sequencing system 10. The sequencing system 10 may have a plurality of integrated circuits (IC) 11a, 11b, and 11c. Each IC may have an input 17, a sequence output 15, and a diagnostic output 16. The ICs may be connected in a daisy chain, wherein the sequence output of a first IC is electrically connected to the input of a second IC. For example, the sequence output of the first IC 11a may be electrically connected to the input of the second IC 11b, and the sequence output of the second IC 11b may be electrically connected to the input of a third IC 11c, and so on. Each IC may also have a load output 14, which may be electrically connected to a load 13 which may be controlled by input 17. For example, in a sequencing system, the load 13 may comprise an LED load. The LED load may contain one or more LEDs.

The sequencing system 10 may also have a control unit 12. The control unit 12 may be coupled to a first integrated circuit of the plurality of ICs, for example, element 11a. The diagnostic output 16 of each individual IC 11a, 11b, 11c may be electrically connected to the control unit 12. The diagnostic output 16 may report an open circuit condition to the control unit 12. The system illustrated in FIG. 1 illustrates a sequencing system 10 having three (3) ICs, however it is understood that the system may contain any number of ICs.

Figure 2:
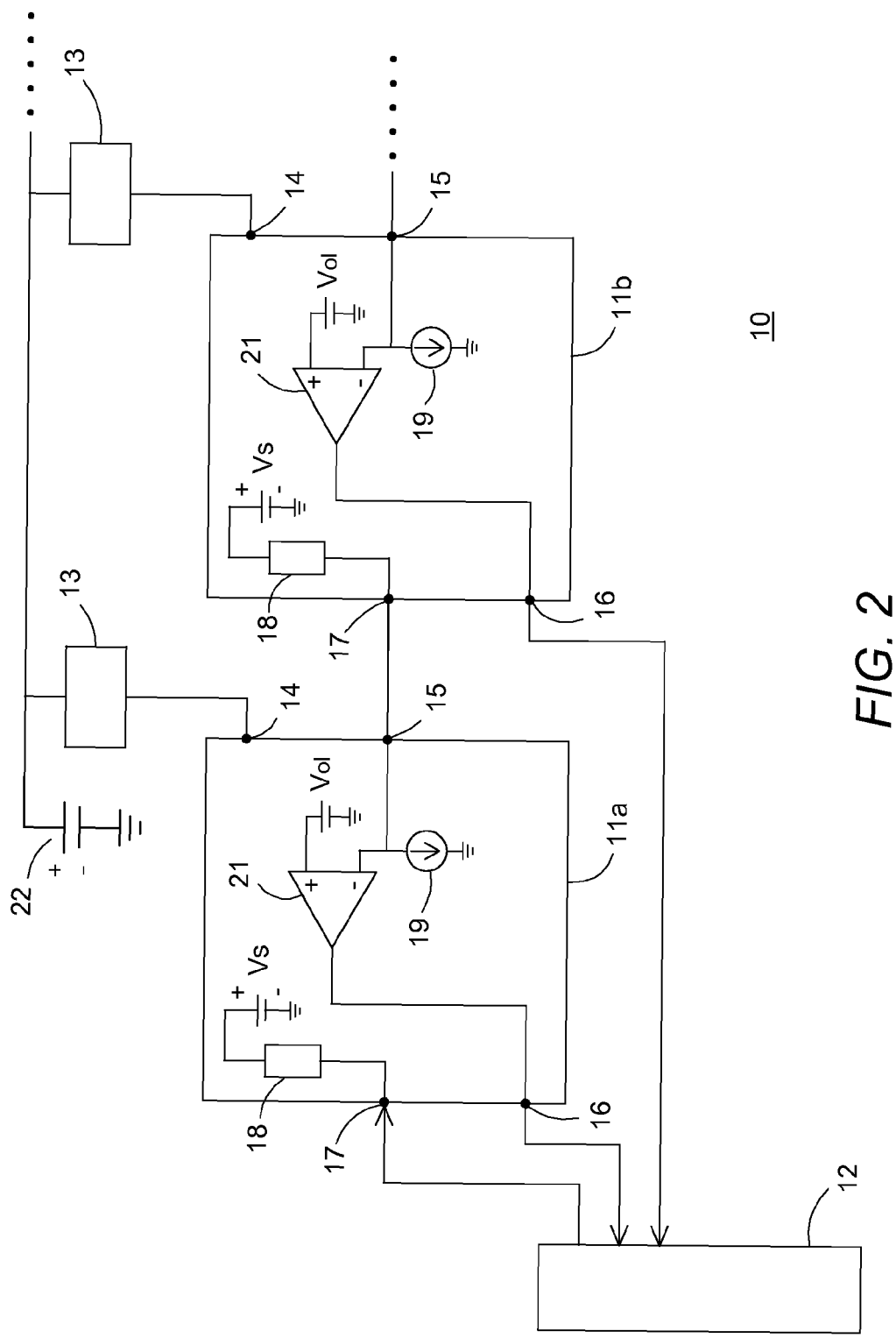
FIG. 2 schematically illustrates an embodiment of a portion of the sequencing system of FIG. 1 in accordance with an embodiment of the present invention.

FIG. 2 illustrates a portion of the sequencing system 10 of FIG. 1. Each IC may have an input 17, a sequence output 15, and a diagnostic output 16. The ICs may be connected in a daisy chain, wherein the sequence output of a first IC is electrically connected to the input of a second IC. For example, the sequence output of the first IC 11a may be electrically connected to the input of the second IC 11b and the sequence output of the second IC 11b may be electrically connected to the input of a third IC 11c (shown in FIG. 1), and so on. Each IC may also have a load output 14, which may be electrically connected to a load 13. For example, in a sequencing system 10, the load 13 may comprise an LED load. The LED load may contain one or more LEDs. For simplicity, functional circuitry for driving load output 14 is not shown.

The sequencing system 10 may also have a control unit 12. The control unit 12 may be a microprocessor and may also serve as a voltage source. The control unit 12 may be coupled to a first integrated circuit 11a of the plurality of ICs. The control unit 12 may provide on/off control. The diagnostic output 16 may be electrically connected to the control unit 12. The diagnostic output 16 may report an open circuit condition to the control unit 12. The embodiment of FIG. 1 illustrates each IC 11a, 11b, 11c having a diagnostic output 16 that may be electrically connected to the control unit 12. The system illustrated in FIG. 2 illustrates a sequencing system 10 having two (2) ICs, however it is understood that the system may contain any number of ICs.

Each IC 11a, 11b may have a diagnostic circuit. The diagnostic circuit may detect an open circuit condition if the intermediate communication signal coupling two ICs is broken. The diagnostic circuit may also detect an open circuit condition if there is an open load. For simplicity, the diagnostic circuit for detecting if there is an open load is not shown. However, according to at least one embodiment, the diagnostic circuit for detecting if there is an open load may be substantially similar to and implemented in substantially the same way as the diagnostic circuit described hereinafter. The diagnostic circuit may comprise a pull-up component 18, an open circuit detection component 21, a first pull-down component 19, and a reference voltage Vol. The first pull-down component 19 may be a current source, the open circuit detection component 21 may be a comparator, and the pull-up component 18 may be a resistor. According to an alternative embodiment, pull-up component 18 may be a current source. The last circuit in the chain may have a separate pull-up component (not shown). For example, during normal operation (i.e. an open circuit condition is not present), the load 13 connected to each IC is on. The pull-up component 18 of the second IC 11b provides a high voltage to the first IC 11a. The high voltage at node 17 also corresponds to a high voltage at node 15. The voltage at node 15 is compared to the reference voltage Vol through the open circuit detection component 21. If there is a positive difference or no difference between the voltage at node 15 and the reference voltage Vol, the output of open circuit detection component 21 will not signal an open circuit condition. If, for example, the intermediate communication signal coupling the first IC 11a and the second IC 11b is broken, the pull-down component 19 of the first IC 11a will become dominant since the pull-up component 18 of the second IC 11b is no longer influencing the voltage at node 15 of the first IC 11a, thereby causing the voltage at node 15 of the first IC 11a to fall to a lower value. The open circuit detection component 21 will now detect a negative difference in the voltage between node 15 of the first IC 11a and the reference voltage Vol. This difference in voltage levels will be interpreted as an open circuit condition. An open circuit signal is then sent to the control unit 12 through the diagnostic output 16 of the first IC 11a. Once the control unit 12 receives the open circuit signal, the entire system can be turned off by a control signal sent from the control unit 12, thereby turning off all loads 13, and for example, if the load 13 is an LED load, all LEDs will be turned off.

The diagnostic circuit or a separate open load detection circuit (not shown) may also detect an open circuit condition if there is an open load, which may be caused by a broken connection between the load output 14 and the load 13. The load 13 may be electrically connected to an OLDC. The OLDC may measure the current through the load 13. For simplicity, the OLDC is not shown, however, according to at least one embodiment, the OLDC may be substantially similar to and implemented in substantially the same way as the diagnostic circuit described above. For example, voltage source 22 may function in a similar way to voltage source Vs, load 13 may function in a similar way to pull-up component 18, and additional circuitry within the ICs 11a and 11b which are similar to the diagnostic circuit described above may be implemented. Thus, if, for example, there is an open load caused by a disconnection of the load output 14 of the second IC 11b from the load 13, an open load signal could be sent to the control unit 12 through the diagnostic output 16 of the second IC 11b, or alternatively through a separate open load diagnostic output (not shown). Once the control unit 12 receives the open load signal, the entire system can be turned off by a control signal sent from the control unit 12, thereby turning off all loads 13, and for example, if the load 13 is an LED load, all LEDs will be turned off.

Figure 3:
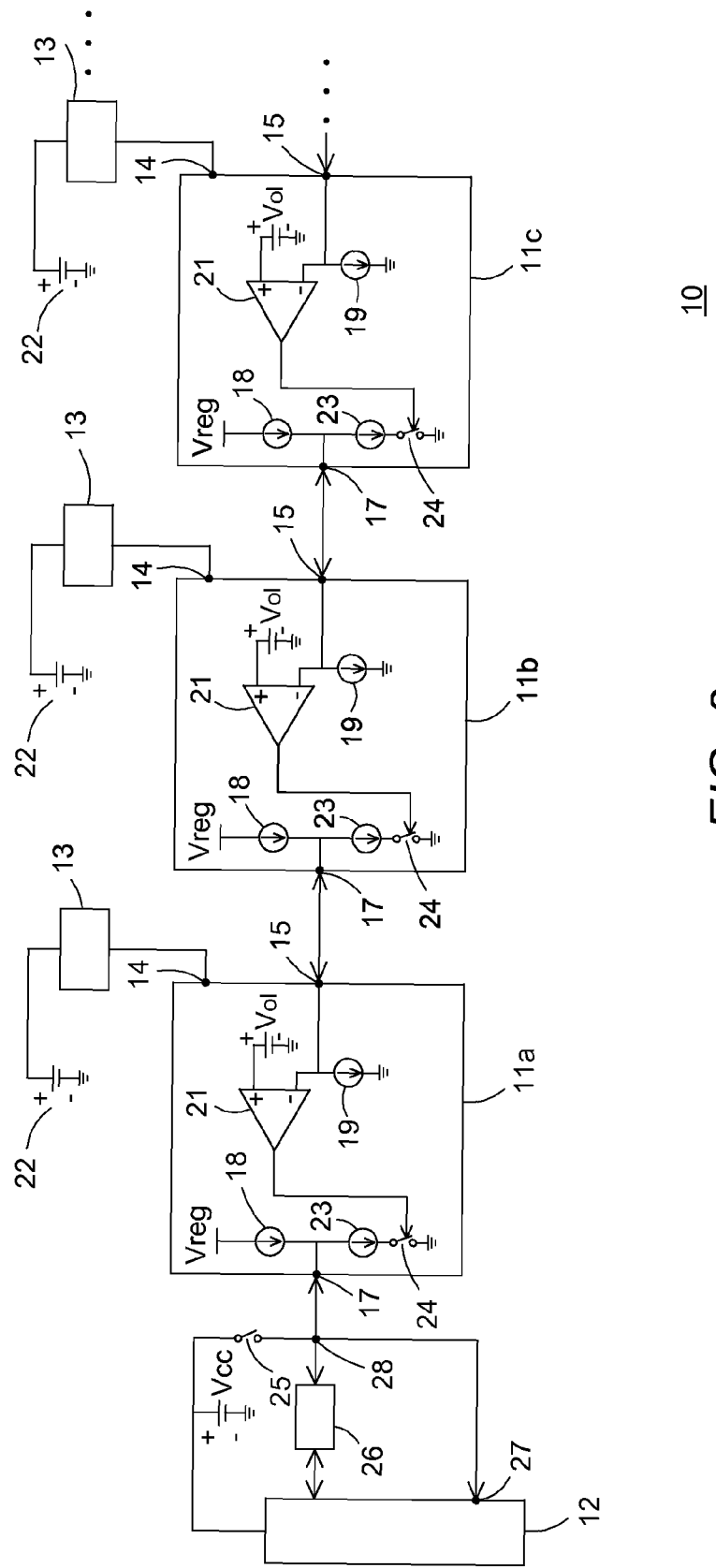
FIG. 3 schematically illustrates an embodiment of a sequencing system in accordance with an embodiment of the present invention.

FIG. 3 schematically illustrates an embodiment of a sequencing system 10. Each IC may have an input 17, and a sequence output 15. The ICs may be connected in a daisy chain, wherein the output of a first IC is electrically connected to the input of a second IC. For example, the output of the first IC 11a may be electrically connected to the input of the second IC 11b, and the output of the second IC 11b may be electrically connected to the input of a third IC 11c, and so on. Each IC may also have a load output 14, which may be electrically connected to a load 13. For example, in a sequencing system 10, the load 13 may comprise an LED load. The LED load may contain one or more LEDs.

The sequencing system 10 may also have a control unit 12. The control unit 12 may be a microprocessor and may also serve as a voltage source. The control unit 12 may be coupled to a first integrated circuit 11a of the plurality of ICs. The control unit 12 may provide on/off control. The system of FIG. 3 illustrates a sequencing system 10 having three (3) ICs, however it is understood that the system may contain any number of ICs.

Each IC 11a, 11b, 11c may have a diagnostic circuit. The diagnostic circuit may detect an open circuit condition when the intermediate communication signal coupling two ICs is broken. The diagnostic circuit may also detect an open circuit condition if there is open load. The diagnostic circuit may comprise a pull-up component 18, an open circuit detection component 21, a first pull-down component 19, a second pull-down component 23, a fault switch 24, and a reference voltage Vol. The first pull-down component 19 may be a current source, the open circuit detection component 21 may be a comparator, and the pull-up component 18 may be a resistor. According to the present embodiment in FIG. 3, pull-up component 18 is shown as a current source. The last circuit in the chain may have a separate pull-up component (not shown). For example, during normal operation (i.e. an open circuit condition is not present), the load connected to each IC is turned off. The pull-up components 18 of the first IC 11a, the second IC 11b, and third IC 11c provide high voltages at nodes 17. The high voltage at node 17 also corresponds to a high voltage at node 15. The voltage at node 15 is compared to the reference voltage Vol through the open circuit detection component 21. If there is a positive difference or no difference between the voltage at node 15 and the reference voltage Vol, the output of open circuit detection component 21 will not signal an open circuit condition, thereby leaving the fault switch 24 open. If, for example, the intermediate communication signal coupling the second IC 11b and the third IC 11c is broken, the pull-down component 19 of the second IC 11b will become dominant since the pull-up component 18 of the third IC 11c is no longer influencing the voltage at node 15 of the second IC 11b, thereby causing the voltage at node 15 of the second IC 11b to fall to a value less than the reference voltage Vol. The open circuit detection component 21 will now detect a negative difference in the voltage between node 15 of the second IC 11b and the reference voltage Vol. This difference in voltage levels will be interpreted as an open circuit condition. This open circuit condition causes the LED load of the second IC 11b to be turned off. An open circuit signal is then sent to the fault switch 24 of the second IC 11b. When the fault switch 24 of the second IC 11b receives the open circuit signal, the fault switch 24 closes, thereby turning on the second pull-down component 23 of the second IC 11b. Since the second pull-down component 23 is much greater than the pull-up component 18, the voltage at node 17 of the second IC 11b and the voltage at node 15 of the first IC 11a are lowered to a value less than Vol.

Therefore, since the voltage at node 15 of the first IC is lower than the reference voltage Vol, the open circuit detection component 21 will now detect a negative difference in the voltage between node 15 of the first IC 11a and the reference voltage Vol. This difference in voltage levels will be interpreted as an open circuit condition. The open circuit condition causes the LED load of the first IC 11a to be turned off. An open circuit signal is then sent to the fault switch 24 of the first IC 11a. When the fault switch 24 of the first IC 11a receives the open circuit signal, the fault switch 24 closes, thereby turning on the second pull-down component 23 of the first IC 11a. Since the second pull-down component 23 is much greater than the pull-up component 18, the voltage at node 17 of the first IC 11a is lowered. The voltage at node 17 of first IC 11a is reported to the control unit 12 through the diagnostic reporting input 27, where a low voltage at node 17 is interpreted as an open circuit condition.

The diagnostic circuit or a separate OLDC (not shown) may also detect an open circuit condition if there is open load, which may be caused by a broken connection between the load output 14 and the load 13. The load 13 may be electrically connected to an OLDC. The OLDC may measure the current through the load 13, and could be electrically connected to the fault switch 24. For simplicity, the OLDC is not shown, however, according to at least one embodiment, the OLDC may be substantially similar to and implemented in substantially the same way as the diagnostic circuit described above. For example, voltage source(s) 22 may function in a similar way to voltage source Vreg, load 13 may function in a similar way to pull-up component 18, and additional circuitry within the ICs 11a, 11b, and 11c which are similar to the diagnostic circuit described above may be implemented. Thus, if, for example, there is an open load caused by a disconnection of the load output 14 of the second IC 11b from the load 13, an open load signal could be sent to the fault switch 24 of the second IC 11b. When the fault switch 24 of the second IC 11b receives the open load signal, the fault switch 24 closes, thereby turning on the second pull-down component 23 of the second IC 11b. Since the second pull-down component 23 is much greater than the pull-up component 18, the voltage at node 17 of the second IC 11b and the voltage at node 15 of the first IC 11a are lowered to a value less than Vol. Therefore, since the voltage at node 15 of the first IC is lower than the reference voltage Vol, the open circuit detection component 21 will now detect a negative difference in the voltage between node 15 of the first IC 11a and the reference voltage Vol. This difference in voltage levels will be interpreted as an open circuit condition. An open circuit signal is then sent to the fault switch 24 of the first IC 11a. When the fault switch 24 of the first IC 11a receives the open circuit signal, the fault switch 24 closes, thereby turning on the second pull-down component 23 of the first IC 11a. Since the second pull-down component 23 is much greater than the pull-up component 18, the voltage at node 17 of the first IC 11a is lowered. The voltage at node 17 of first IC 11a is reported to the control unit 12 through the diagnostic reporting input 27, where a low voltage at node 17 is interpreted as an open circuit condition.

Once the control unit 12 receives the open circuit signal, the fault information may be available to other parts of the vehicle. The sequencing system 10 may be reset by using a clear switch 25 connected to Vcc. The clear switch 25 may be connected to the control unit 12 through a separate pin, or may be connected to another system device which is connected to Vcc.

In view of all the above, it is evident that a novel system is disclosed. Included in one embodiment, among other features, is a diagnostic reporting circuit that detects an open circuit condition. The system ensures that if an open circuit condition is detected, all loads are turned off.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention, and form different embodiments, as would be understood by those skilled in the art.

We claim:

1. A sequencing lighting system comprising:
   at least two integrated circuits, wherein each integrated circuit comprises a control input and a sequence output;
   a control unit coupled to a first integrated circuit of the at least two integrated circuits;
   an intermediate communication signal coupling the sequence output of the first integrated circuit to the control input of a second integrated circuit of the at least two integrated circuits;
   a diagnostic circuit contained within each integrated circuit, wherein the diagnostic circuit detects an open circuit condition and produces an open circuit signal.

2. The sequencing lighting system of claim 1, wherein each integrated circuit comprises a diagnostic output.

3. The sequencing lighting system of claim 2, wherein the diagnostic output is electrically coupled to the control unit.

4. The sequencing lighting system of claim 3, wherein the open circuit signal is sent to the control unit through the diagnostic output when the diagnostic circuit detects an open circuit condition.

5. The sequencing lighting system of claim 1, wherein the open circuit signal is propagated to the control unit through the diagnostic circuits and intermediate communication signals when an open circuit condition is detected.

6. The sequencing lighting system of claim 1, comprising an LED load electrically connected to each of the integrated circuits, wherein the LED load is turned off when the open circuit condition is detected.

7. An open circuit detection system comprising:
   at least two integrated circuits, wherein each integrated circuit comprises a control input and a sequence output;
   a control unit coupled to a first integrated circuit of the at least two integrated circuits;
   an intermediate communication signal coupling the sequence output of the first integrated circuit to the control input of a second integrated circuit of the at least two integrated circuits;
   a diagnostic circuit contained within each integrated circuit, wherein the diagnostic circuit detects an open circuit condition and produces an open circuit signal.

8. The open circuit detection system of claim 7, wherein each integrated circuit comprises a diagnostic output.

9. The open circuit detection system of claim 8, wherein the diagnostic output is electrically coupled to the control unit.

10. The open circuit detection system of claim 9, wherein the open circuit signal is sent to the control unit through the diagnostic output when the diagnostic circuit detects an open circuit condition.

11. The open circuit detection system of claim 1, wherein the open circuit signal is propagated to the control unit through the diagnostic circuits and intermediate communication signals when an open circuit condition is detected.

12. A method for forming an open circuit detection system comprising:
providing at least two integrated circuits, wherein each integrated circuit comprises a control input and a sequence output;
providing a control unit coupled to a first integrated circuit of the at least two integrated circuits;
providing an intermediate communication signal coupling the sequence output of the first integrated circuit to the control input of a second integrated circuit of the at least two integrated circuits;
providing a diagnostic circuit contained within each integrated circuit, wherein the diagnostic circuit detects an open circuit condition and produces an open circuit signal.

13. The method for forming an open circuit detection system of claim 12, wherein each integrated circuit comprises a diagnostic output.

14. The method for forming an open circuit detection system of claim 13, wherein the diagnostic output is electrically coupled to the control unit.

15. The method for forming an open circuit detection system of claim 14, wherein the open circuit signal is sent to the control unit through the diagnostic output when the diagnostic circuit detects an open circuit condition.

16. The method for forming an open circuit detection system of claim 12, wherein the open circuit signal is propagated to the control unit through the diagnostic circuits and intermediate communication signals when an open circuit condition is detected.

17. The method for forming an open circuit detection system of claim 12, providing an LED load electrically connected to each of the integrated circuits, wherein the LED load is turned off when the open circuit condition is detected.

* * * * *